United States Patent
Jamieson et al.

[11] Patent Number: 6,060,777
[45] Date of Patent: May 9, 2000

[54] UNDERSIDE HEAT SLUG FOR BALL GRID ARRAY PACKAGES

[75] Inventors: Mark P. Jamieson, Folsom; Joseph C. Barrett, El Dorado, both of Calif.

[73] Assignee: Intel Corporation, Santa Clara, Calif.

[21] Appl. No.: 09/119,863

[22] Filed: Jul. 21, 1998

[51] Int. Cl.[7] .................................................. H01L 23/10
[52] U.S. Cl. ......................................... 257/707; 257/738
[58] Field of Search .................................... 257/706, 707, 257/720, 737, 738

[56] References Cited

U.S. PATENT DOCUMENTS

| | | | |
|---|---|---|---|
| 5,172,301 | 12/1992 | Scneider | 257/720 |
| 5,287,247 | 2/1994 | Smits et al. | 257/720 |
| 5,583,377 | 12/1996 | Higgins, III | 257/706 |
| 5,751,063 | 5/1998 | Baba | 257/723 |
| 5,834,839 | 11/1998 | Mertol | 257/707 |
| 5,856,911 | 1/1999 | Riley | 257/707 |

*Primary Examiner*—David Hardy
*Attorney, Agent, or Firm*—Blakely, Sokoloff, Taylor & Zafman LLP

[57] ABSTRACT

An integrated circuit package which includes an integrated circuit that is attached to a first side of a substrate. The package may also have a solder ball and a heat slug that are both attached to a second side of the substrate. The heat slug and solder ball can be attached to a printed circuit board. The heat slug can provide a thermal path from the substrate to the circuit board which has a relatively wide area. The wide area reduces the thermal impedance and the junction temperatures of the integrated circuit for a given amount of heat.

10 Claims, 1 Drawing Sheet

UNDERSIDE HEAT SLUG FOR BALL GRID ARRAY PACKAGES

BACKGROUND OF THE INVENTION

1. Field of the Invention

The present invention relates to an integrated circuit package.

2. Background Information

Integrated circuits are typically assembled into a package that is mounted to a printed circuit board. FIG. 1 shows an integrated circuit package commonly referred to as a plastic ball grid array (PBGA) package. The PBGA package includes an integrated circuit 1 that is mounted to a substrate 2. Bond wires 3 may connect the integrated circuit 1 to a top surface of the substrate 2. The integrated circuit 1 and bond wires 3 may be enclosed by an encapsulant 4.

The package has a plurality of solder balls 5 that are attached to a bottom surface of the substrate 2. The substrate 2 is typically a printed circuit board which has routing traces, vias, etc. which electrically connect the integrated circuit 1 to the external solder balls 5. The solder balls 5 are reflowed to attach the package to a printed circuit board 6.

The integrated circuit 1 generates heat which must be removed from the package. Some integrated circuit packages incorporate heat slugs, heat sinks and other thermal elements which are attached to the top surface of the package. The additional thermal elements can add to the complexity and cost of mass producing the package.

A portion of the heat generated by the integrated circuit 1 may flow into the printed circuit board 6 through the solder balls 5. The thermal impedance through the solder balls 5 is inversely proportional to the area of the balls 5. The solder balls 5 have a relatively small cross-sectional area. The relatively small solder ball area therefore creates a relatively high thermal impedance. The junction temperatures of the integrated circuit are proportional to the thermal impedance of the balls. A higher impedance increases the junction temperatures for a given amount of heat. It would be desirable to provide a PBGA package that more efficiently transfers heat into the printed circuit board than packages of the prior art.

SUMMARY OF THE INVENTION

One embodiment of the present invention is an integrated circuit package which includes an integrated circuit that is attached to a first side of a substrate. The package may also have a solder ball and a heat slug that are both attached to a second side of the substrate.

DETAILED DESCRIPTION OF THE INVENTION

One embodiment of the present invention is an integrated circuit package which includes an integrated circuit that is attached to a first side of a substrate. The package may also have a solder ball and a heat slug that are both attached to a second side of the substrate. The heat slug and solder ball can be attached to a printed circuit board. The heat slug can provide a thermal path from the substrate to the circuit board which has a relatively wide area. The wide area reduces the thermal impedance and the junction temperatures of the integrated circuit for a given amount of heat.

Figure 1:
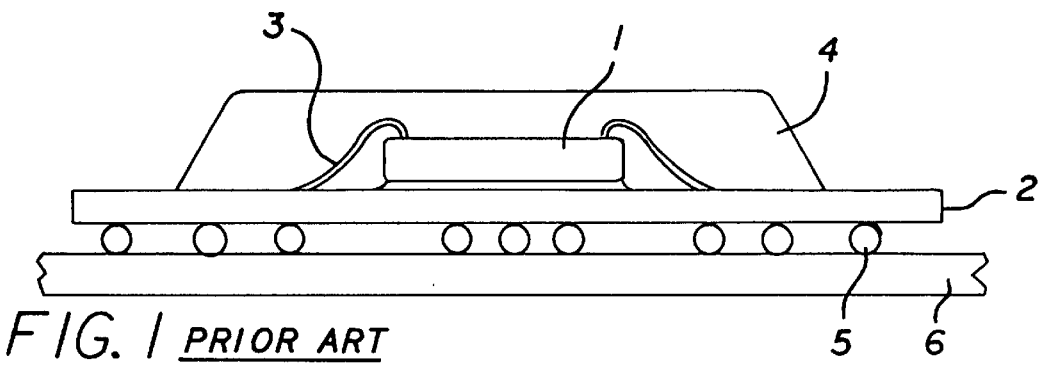
FIG. 1 is a side sectional view of an integrated circuit package of the prior art.
Figure 2:
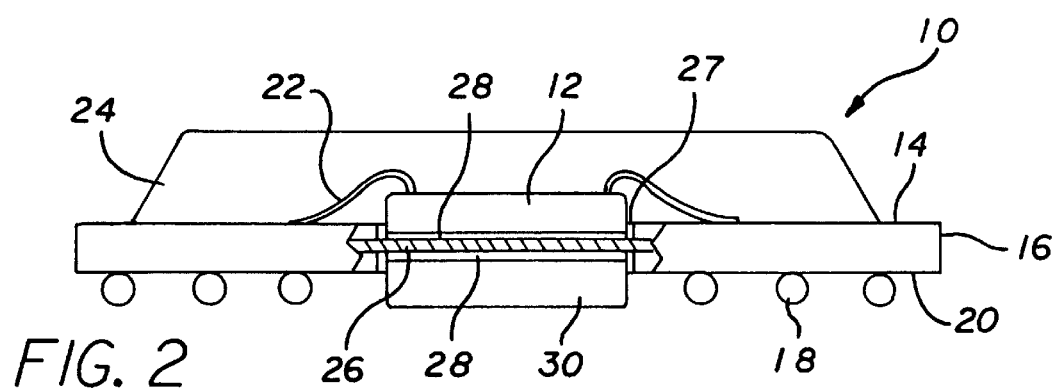
FIG. 2 is a side sectional view showing an embodiment of an integrated circuit package of the present invention.

Referring to the drawings more particularly by reference numbers, FIG. 2 shows an embodiment of an integrated circuit package 10 of the present invention. The package 10 may include an integrated circuit 12 that is attached to a first side 14 of a substrate 16. The package 10 may also have a plurality of solder balls 18 that are attached to a second side 20 of the substrate 16.

The substrate 16 may be a printed circuit board which is constructed from layers of dielectric and conductive material. The conductive material may be copper which is formed into patterns. The copper patterns may include surface pads and routing traces (not shown) on the first 14 and second 20 sides of the substrate 16. The solder balls 18 may be attached to surface pads on the second side 20. The surface pads on the first side 14 may be connected to the integrated circuit 12 by a plurality of bond wires 22. The bond wires 22 and integrated circuit 12 may be enclosed by a protective encapsulant 24. Vias (not shown) may be formed in the substrate 16 to electrically connect the integrated circuit 12 to the solder balls 18.

The substrate 16 may have an exposed conductive layer 26 that extends across a center opening 27 in the dielectric layers of the substrate 16. The conductive layer 26 may be exposed by cutting openings in the dielectric before lamination or etching the dielectric after lamination of the substrate 16. The integrated circuit 12 may be mounted to the exposed conductive layer 26 by a thermally conductive epoxy 28.

A first heat slug 30 may be attached to the second side 20 of the substrate 16. The heat slug 30 can be attached directly to the exposed conductive layer 26 of the substrate 16 by a thermally conductive epoxy 28. The heat slug 30 may be a strip of thermally conductive material such as aluminum or copper.

Figure 3:
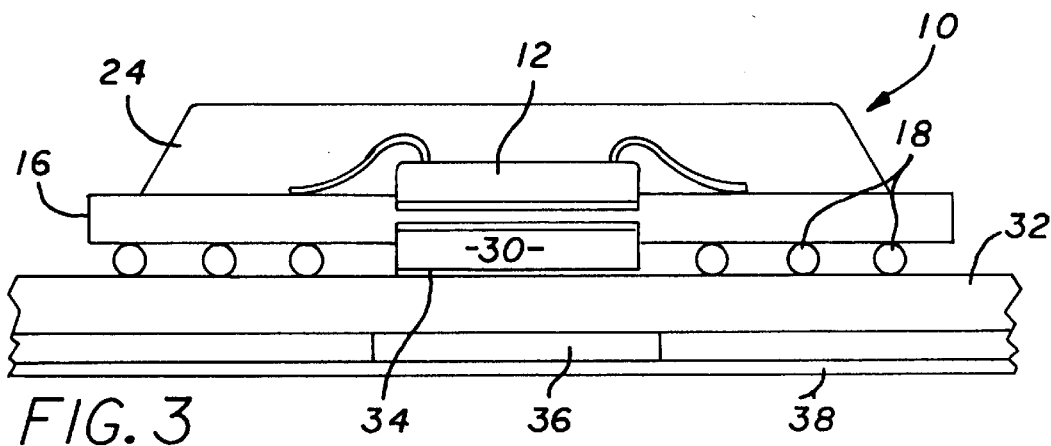
FIG. 3 is a side sectional view showing the integrated circuit package within an electronic assembly.

FIG. 3 shows the package 10 mounted to a printed circuit board 32. By way of example, the printed circuit board 32 may be a motherboard of a computer system. The solder balls 18 are reflowed onto corresponding conductive surface pads (not shown) of the circuit board 32. The first heat slug 30 may be attached to the printed circuit board 32 by a solder or an adhesive material. Alternatively, the heat slug 30 may be pressed into the circuit board 32 by the interconnection of the solder balls 18 and the board 32.

The heat slug 30 provides a direct thermal path from the integrated circuit 12 to the printed circuit board 32. The thickness of the heat slug 30 should be controlled to insure that the solder balls 18 will become attached to the printed circuit board 32 in an embodiment where the solder is reflowed. A thermal grease 34 may be located between the heat slug 30 and the circuit board 32 when the slug 30 is not attached to the board 32. The thermal grease 34 can provide a thermal path into the circuit board 32 while compensating for tolerances in the height of the electronic assembly.

A second heat slug 36 may be attached to the printed circuit board 32. Although not shown, the second heat slug 36 may extend through an opening in the circuit board 32 and be directly coupled to the first heat slug 30. The second heat slug 36 may be coupled to the chassis 38 of a computer. The first 30 and second 36 heat slugs can thus provide a direct thermal path from the integrated circuit 12 to the computer chassis 38.

Figure 4:
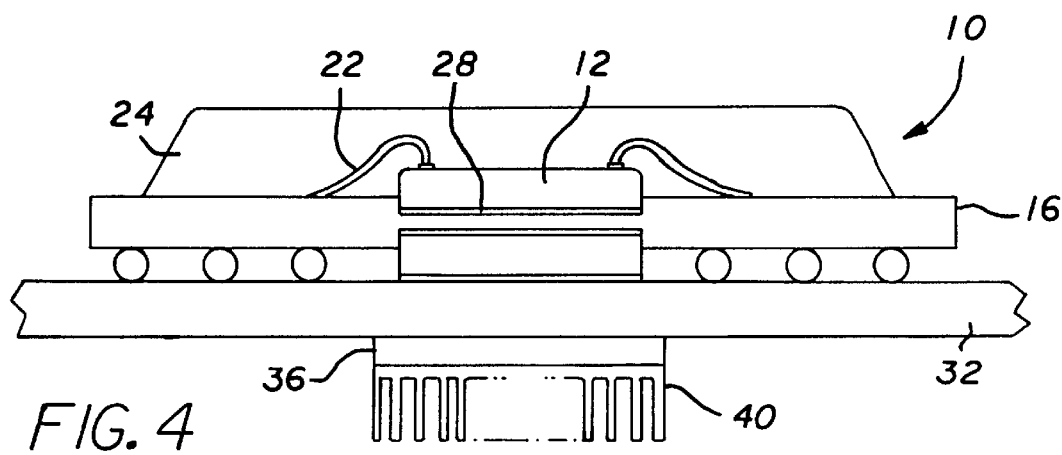
FIG. 4 is a side sectional view showing the integrated circuit package within an alternate electronic assembly.

FIG. 4 shows an alternate embodiment, wherein a heat sink 40 is attached to the second heat slug 36. The heat sink 40 may be in the flow path of a fan which removes the heat generated by the integrated circuit 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, the first heat slug 30 may be attached directly to the bottom surface of the integrated circuit 12. Alternatively, the substrate 16 may not have openings in the dielectric, wherein the integrated circuit 12 is mounted to a dielectric surface on the first side 14 of the substrate 16 and the heat slug 30 is mounted to a dielectric surface on the second side 20 of the substrate 16.

What is claimed is:

1. An electronic assembly, comprising:

a substrate which has a first side and a second side;

an integrated circuit attached to said first side of said substrate;

a solder ball attached to said second side of said substrate;

a first heat slug that is coupled to said integrated circuit and which extends into said substrate, and from said second side of said substrate;

a printed circuit board attached to said solder ball and thermally coupled to said first heat slug; and, a second heat slug attached to said printer circuit board.

2. The assembly as recited in claim 1, further comprising a computer chassis attached to said second heat slug.

3. The assembly as recited in claim 1, further comprising a heat sink attached to said second heat slug.

4. The package as recited in claim 1, wherein said first heat slug is adjacent to said integrated circuit.

5. The package as recited in claim 1, wherein said substrate has a conductive layer that is attached to said integrated circuit and said first heat slug.

6. The package as recited in claim 1, wherein said second heat slug extends through said printed circuit board.

7. A method for assembling an integrated circuit package, comprising:

attaching an integrated circuit to a first side of a substrate which also has a second side;

attaching a solder ball and a first heat slug to said second side of said substrate, wherein said first heat slug extends into said substrate;

attaching said solder ball and said first heat slug to a printed circuit board; and, attaching a second heat slug to said printed circuit board.

8. The method as recited in claim 7, further comprising encapsulating said integrated circuit.

9. The method as recited in claim 7 further comprising coupling said second heat slug to a computer chassis.

10. The method as recited in claim 7 further comprising attaching said second heat slug to a heat sink.

* * * * *